United States Patent
Gloede et al.

(10) Patent No.: US 7,754,975 B2
(45) Date of Patent: Jul. 13, 2010

(54) PLASTIC COMPONENT HAVING HEAT RESISTANT HARDENED RESIN AT THERMAL-ATTACHMENT CONNECTION POINTS

(75) Inventors: Stefan Gloede, Nürnberg (DE); Jürgen Hagen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1042 days.

(21) Appl. No.: 11/481,720

(22) Filed: Jul. 5, 2006

(65) Prior Publication Data

US 2007/0160829 A1    Jul. 12, 2007

(30) Foreign Application Priority Data

Jul. 5, 2005    (DE)    ........................ 10 2005 031 377

(51) Int. Cl.
*H05K 1/00*    (2006.01)
(52) U.S. Cl. .................. 174/252; 361/809; 361/812
(58) Field of Classification Search ................ 174/252, 174/267; 361/809, 812
See application file for complete search history.

(56) References Cited

U.S. PATENT DOCUMENTS

| | | | |
|---|---|---|---|
| 4,774,126 A | 9/1988 | Dorsey et al. | |
| 5,904,954 A | 5/1999 | Cassat et al. | |
| 5,948,831 A | 9/1999 | Broer et al. | |
| 5,996,222 A | 12/1999 | Shangguan et al. | |
| 6,193,937 B1 | 2/2001 | Broer et al. | |
| 6,369,332 B1* | 4/2002 | Saitoh et al. | ................ 174/260 |
| 6,638,449 B2 | 10/2003 | Broer et al. | |
| 2002/0037838 A1* | 3/2002 | Kono et al. | ................... 514/4 |
| 2006/0131071 A1* | 6/2006 | Hiramatsu et al. | .......... 174/266 |

OTHER PUBLICATIONS

"Handbook of Plastics, Elastomers and Composites, Second Edition," Harper (ed.), 1992, pp. 1.20-1.21.

* cited by examiner

*Primary Examiner*—Jeremy C Norris
(74) *Attorney, Agent, or Firm*—Schiff Hardin LLP

(57) ABSTRACT

A plastic component with a metal layer applied to the surface for electrical contacting of electrical elements ensuing in a thermal attachment method, particularly in a soldering method, has a layer composed of a duroplastic synthetic or a highly heat-resistant thermoplastic synthetic, on which layer a metal layer is applied, applied on the component carrier made of a thermoplastic synthetic, at least in the region of the contacting point or points. The duroplastic synthetic is a hardened resin, and the resin layer is generated by application of the liquid resin by serigraphy, roller coating or spraying, or the highly heat-resistant thermoplastic synthetic is applied in the form of a film.

9 Claims, 1 Drawing Sheet

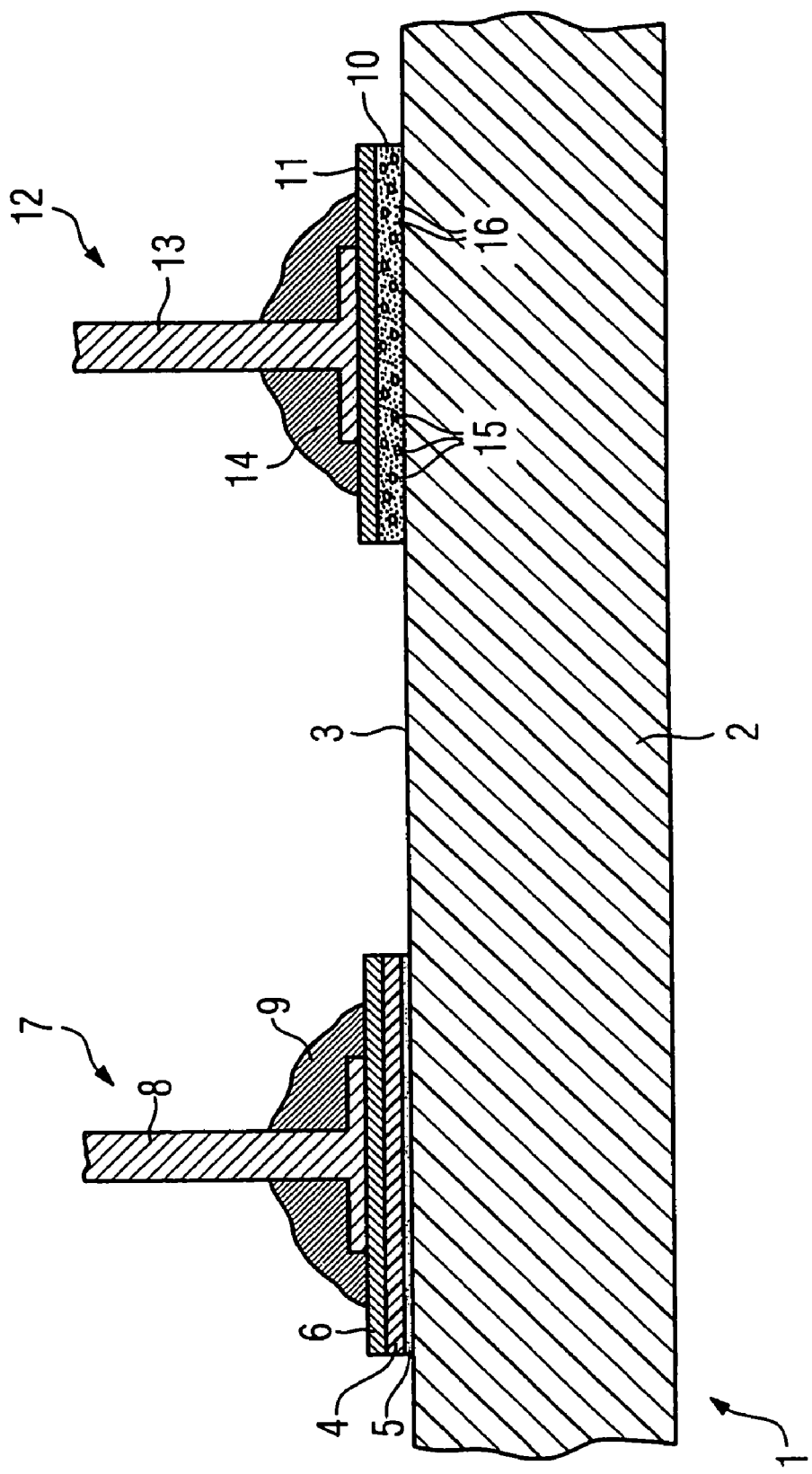

PLASTIC COMPONENT HAVING HEAT RESISTANT HARDENED RESIN AT THERMAL-ATTACHMENT CONNECTION POINTS

BACKGROUND OF THE INVENTION

1. Field of the Invention

The present invention concerns a plastic (synthetic) component of the type having a metal layer applied to the surface for electrical contacting of electrical elements by a thermal attachment method, particularly a soldering method, having a layer of a duroplastic synthetic, a highly heat-resistant thermoplastic synthetic, on which the metal layer is applied, applied on the component carrier that is also made of a thermoplastic synthetic, at least in the region of the contacting point or points.

2. Description of the Prior Art

In different applications it is sometimes necessary to attach one or more further electrical elements on a plastic component provided with a metal layer applied on its surface and, via the metal layer, to contact further elements therewith. This electrical contacting normally ensues in a soldering method, meaning that the components to be connected with the metal layer are thermally soldered either manually or automatically. An application example for this is a housing component of a sheath wave barrier for a magnetic resonance system, the housing component being formed of plastic with diverse elements arranged therein. These diverse elements are contacted with the surface metallization located on an external housing component side and are contacted via this metallization with the elements to be soldered on the surface.

Upon soldering, temporary temperatures around approximately 300° act on the surface metallization and also on the plastic component itself. This high temperature load, although brief, normally leads to the polymer substance being damaged. Thermoplastic polymers that soften due to the temperature stress in the limit temperature range are typically used to form such plastic components. This local softening generally leads to an impairment of the bonding of the surface metallization, up to the detachment thereof. This inevitably leads to the situation that the electrical contact of the soldered element also either fails to be accomplished at all, or is accomplished in a sub-standard manner.

In order to prevent a detachment and achieve a good adhesion of the surface metallization with the plastic material, in such cases highly heat-resistant plastics are used, but such plastics require a relatively large effort to produce. Moreover, such special plastics have high material costs.

U.S. Pat. No. 4,774,126 discloses a structural component having an economical thermoplastic material as the carrier. A highly heat-resistant thermoplastic material on which metallic layers can be soldered is wholly or partially molded on the carrier. Printed circuit boards are primarily described.

An elastic composite material is disclosed in DE 695 10 786 T2. This has a continuous carrier layer and at least one protective layer applied on the carrier layer, whereby at least one of the protective layers is formed by a thermo-resistant resin which is applied in flakes on the surface of the carrier. The composite material should be thermally and elastically insulating and also moisture-sealed, and it can serve as a printed circuit board.

SUMMARY OF THE INVENTION

An object of the present invention is to provide a plastic component that is simple and cost-effective in terms of production and that also enables an unproblematic electrical contacting of additional elements by thermal contacting methods such as soldering.

This object is achieved in accordance with the invention by a plastic component of the aforementioned type wherein the duroplastic synthetic is a hardened (cured) resin, and the resin layer is generated by the application of the liquid resin by serigraphy, roller coating or spraying, or that the highly heat-resistant thermoplastic synthetic is applied in the form of a film (foil).

The inventive plastic component has a component carrier composed of a commercially available thermoplastic synthetic that is simple to process and cost-effective from the point of view of material costs, on the surface of which however a "heat trap" is attached to protect against unacceptably high thermal load during the soldering of the elements to be contacted. This heat trap is attached in the form of a layer of a duroplastic synthetic or a highly heat-resistant thermoplastic synthetic on which the metal layer serving for the contacting is then applied. The duroplastic synthetic or the highly heat-resistant synthetic is not damaged by the increased temperature upon soldering. The temperature penetration to the substrate material, thus the commercially available thermoplastic synthetic, is slowed; only a slight heating of the substrate material occurs that in no case leads to a damaging. The electrical contacting can be implemented and completed without damaging the substrate material.

The inventive plastic component consequently allows the use of thermoplastic synthetic that is simple to process and cost-effective with a simultaneous possibility of a secure contacting of additional electrical components since a thermal damage of the base material is advantageously prevented via the applied additional plastic layer (which is preferably applied very thin with a thickness of 5-75 μm, in particular $\leq 50$ μm). The layer serving as a heat protection can thereby be applied over large areas or the entire area on the surface of the component carrier. It is also possible to apply this layer selectively only where a metal layer is required, thus where an element is to be positioned.

A hardened resin or a resin system is used as the duroplastic synthetic that can be used as a first embodiment (described above) to form the thermal blocking layer, whereby an epoxy resin, an acrylic resin or a phenol resin is suitable for this. All of these resins exhibit a low thermal conductivity such that damage to the underlying thermoplasts forming the carrier is precluded, or would be expected only in the case of an extremely long and extremely intensive temperature exposure, which is, however, not the case for the contacting of electrical elements lasting only a few seconds. The cited resins can be metallized without further measures in a subsequent processing step. A wide range of different techniques can be used for metallization. The "classical" plastic metallization methods as well as primer techniques in the field of wet-chemical systems are examples, i.e., known chemical or galvanic metal coating methods. Metallization by PVD techniques (physical methods for metallization) is also possible.

The resin layer is likewise applied on the component carrier in a coating method, namely by serigraphy, roller coating or spraying. The manner of the coating ultimately depends on the material used and the component geometry.

As an alternative to the use of duroplastic plastics or plastic systems, according to the invention a highly heat-resistant thermoplastic synthetic can be applied as described in a thin layer. For example, PPS (polyphenyl sulfide), PPA (polyphtalamide), PES (polyether sulfone), PEEK (polyether therketone), PEI (polyether imide), PSU (polysulfone) or LCP (liquid crystal polymer) can be used as highly heat-resistant plastics. All of these plastics are also stable in the range of high temperatures, thus maintain their state without further measures at the temperatures of approximately 300° C. predominating upon soldering. New, lead-free soldering systems such as Sn—Ag or Sn—Cu—Ni, which likewise require a high soldering temperature as a result of a shift of the eutectic point to temperatures of approximately 220° C., thus can be used without further measures. The metallization of the described highly heat-resistant thermoplastic synthetics can likewise ensue by any of the chemical, galvanic or physical coating methods described above.

Although the duroplastic synthetics are applied in a liquid state in the case of the described resin systems, in the case of highly heat-resistant thermoplastic synthetics these are applied in the form of a film. This film coating can likewise ensue in any manner, for example by lamination or gluing. Such films are already widely available as standard films.

If appropriate, one or more additives (in particular to increase the flammability safety) and/or one or more filler materials can also be added to the duroplastic or highly heat-resistant thermoplastic synthetic layers. The use of some additives or filler materials particular possible without further measures in the cases of the resin systems, since these are made ready for use only immediately before their application.

For example, TBBA (tetrabrombiphenol A) can be added as an additive to increase the flammability rating. The addition of metallic particles such as palladium, copper or iron is also advantageous because in this case a special primer is no longer necessary for subsequent metallization. For example, glass powder can be used as a filler material to adjust specific physical, chemical or mechanical properties.

As described, it is sufficient to apply the plastic layer thin with a thickness of 5-75 μm, preferably ≦50 μm. With regard to the very short duration of the thermal load, such layer thicknesses suffice to prevent a too-severe heat transport to the underlying thermoplastic material.

As described, the plastic component can be a housing component, particularly a housing component of a sheath wave barrier for a magnetic resonance system. Naturally, the invention is not limited to this type of component. Rather, the plastic component can be any arbitrarily shaped plastic component or any plastic component that is to be provided for many different usages.

DESCRIPTION OF THE DRAWING

The single FIGURE is a sectional view showing two exemplary embodiments of a plastic component according to the present invention.

DESCRIPTION OF THE PREFERRED EMBODIMENTS

A sectional view of a portion of an inventive plastic component 1 is shown in the single FIGURE, the plastic component 1 in this example being a housing component of a sheath wave barrier for a magnetic resonance system. The plastic component has a component carrier 2, for example a laminar housing cover plate on its top side 3. The component carrier 2 is composed of a commercially available thermoplastic material of any type.

In order to be able to contact electrical elements (which are not shown in detail in the FIGURE) with electrical elements located within the housing or the like (likewise not shown in detail), it is sometimes necessary to arrange these on the outside in the region of the surface 3 and to electrically contact these with a surface metallization. This ensues in the course of a soldering method. In order to be able to effect this without thermal damage of the component carrier, a thermal blocking layer in the form of a plastic layer that is resistant to high thermal stresses is initially applied on the top 3 of the component carrier 2 in accordance with the invention.

At the left in the FIGURE is a thermal blocking layer formed by a plastic layer 4 using a highly heat-resistant thermoplastic synthetic 1. Such a highly heat-resistant plastic can, for example, be PPS (semi-crystalline), PPA (semi-crystalline), PEI (amorphous), PES (amorphous), PSU (amorphous), PEEK (semi-crystalline) or LCP (liquid crystal polymer). The respective polymer is applied in the form of a plastic film. In the shown exemplary embodiment the attachment ensues using an adhesive 5. As the FIGURE shows, the highly heat-resistant plastic layer 4 is applied only locally on the surface 3 in the region where an element is to be contacted; this means that the positioning ensues selectively with regard to the contacting schematic of subsequent elements to be attached.

In order to able to contact such an element, a metallization 6 (for example a copper layer applied in any arbitrary deposition method) is applied on the highly heat-resistant thermoplastic synthetic layer 4 (if applicable after prior application of a primer). This metallization 6 proceeds on the component top 3 from a corresponding connection point to a further internally-arranged element or the like that is to be contacted via the metallization 6 to the connection point. In the shown example, an element 7 (of which only one contact leg 8 is shown) is soldered onto the metallization 6 via a solder connection 9.

High temperatures up to 300° C. or more normally arise upon the soldering, which lasts only a few seconds. As a result of the interposition of the highly heat-resistant plastic layer, these high temperatures are not transferred or are transferred only in a small fraction to the thermoplastic polymer material of the component carrier 2. This means that this polymer material is warmed only slightly in the region below the contacting point, and only to a degree that precludes damages of the polymer material in any case. By contrast, without further measures the highly heat-resistant plastic layer 4 is able to withstand the temporarily prevailing high temperatures. The plastic layer 4 absorbs the largest part of the thermal energy itself and relays only a small amount of this to the component carrier.

At right in the FIGURE is a further inventive embodiment using a resin to form the thermally-blocking plastic layer 10. The resin is, for example, an epoxy or phenol resin. The cross-linking reactions in the framework of the respective curing procedure are sufficiently know; the obtained layers exhibit a high thermal stability and low thermal conductivity. The application ensues by printing or spraying, which is possible without further measures in view of the fact that the resin is initially liquid. After the curing a metallization 11 is applied here, if applicable after prior application of a primer. Again, no limitations exist with regard to the coating method. An element 12, of which only a contact leg 13 thereof is shown, is also electrically contacted with the metallization here via a solder connection 14. No significant heating of the material of the component carrier ensues here as well.

To improve or a adjust physical, chemical or mechanical properties it is possible to add additives (primarily TBBA) to the resin, for example to improve the flammability rating. The admixture of metallic particles into the resin is appropriate since the metallization 11 can be directly metallized over this without use of special primers to pre-treat the hardened resin surface. For example, glass powder can be added as filler material. Suitable additives/filler materials are indicated in the FIGURE with the reference characters 15 (additive) and 16 (filler materials). Here as well only a locally limited surface is coated with the epoxy resin. Naturally, the possibility alternatively exists to respectively coat the entire top side 3 with the thermal blocking layer.

The thickness of each of the plastic layers 4 and 10 preferably is <50 μm. This also has the advantage that the overall thermoplastic character of the component is always retained, which is advantageous with regard to recycling measures. The costs incurred in connection with the generation of the thermal blocking layer are also negligible.

Although modifications and changes may be suggested by those skilled in the art, it is the intention of the inventors to embody within the patent warranted hereon all changes and modifications as reasonably and properly come within the scope of their contribution to the art.

We claim as our invention:

1. A plastic component comprising:
    a carrier element comprised of a thermoplastic synthetic having a surface;
    a metal layer completely spaced a distance above said surface, comprising a connection point adapted for electrical contacting of an electrical component by a thermal-attachment technique; and
    a heat trap disposed in said distance between said surface and said metal layer at least below said connection point and completely separating said metal layer from said surface of said carrier element, said heat trap comprising a layer of duroplastic synthetic comprising a hardened resin applied in liquid form by an application technique selected from the group consisting of serigraphy, roller coating and spraying, or a heat-resistant thermoplastic synthetic applied as a film.

2. A plastic component as claimed in claim 1 wherein said heat trap comprises said duroplastic synthetic comprised of a hardened resin, and wherein said resin is a resin selected from the group consisting of epoxy resins, acrylic resins, and phenol resins.

3. A plastic component as claimed in claim 1 wherein said heat trap comprises said heat-resistant thermoplastic synthetic, and wherein said heat-resistant thermoplastic synthetic is selected from the group consisting of PPS, PPA, PES, PEEK, PEI, PSU and LCP.

4. A plastic component as claimed in claim 1 wherein said heat trap comprises at least one additive selected from the group consisting of additives to increase flammability resistance, and additives forming filler materials.

5. A plastic component as claimed in claim 1 wherein said heat trap is a layer having a thickness in a range between 5 μm and 75 μm.

6. A plastic component as claimed in claim 1 wherein said heat trap is a layer having a thickness of less than 50 μm.

7. A plastic component as claimed in claim 1 wherein said carrier comprises a portion of a housing of a sheath wave barrier for a magnetic resonance system.

8. A method for protecting a plastic component from heat damage during contacting of electrical components thereto by a thermal-attachment technique, said plastic component comprising a carrier having a surface with a metallization comprising a contact point at which said thermal-attachment technique ensues, said method comprising the step of:
    on said surface of said carrier, at least at said connection point, applying a duroplastic synthetic in liquid form by an application technique selected from the group consisting of serigraphy, roller coating and spraying, and allowing the liquid resin to cure to form a hardened resin; and
    applying a metallization layer over the hardened resin at least at said connection point, with said duroplastic synthetic film completely separating said metal layer from said surface of said carrier.

9. A method for protecting a plastic component from heat damage during contacting of electrical components thereto by a thermal-attachment technique, said plastic component comprising:
    a carrier having a surface with a metallization comprising a contact point at which said thermal-attachment technique ensues, said method comprising at said surface of said carrier, at least at said connection point, applying a film of a heat-resistant thermoplastic synthetic; and
    applying a metallization layer over said film of heat-resistant thermoplastic synthetic at least at said connection point, with said duroplastic synthetic film completely separating said metal layer from said surface of said carrier.

* * * * *